(12) United States Patent
Balcome et al.

(10) Patent No.: US 6,872,955 B1
(45) Date of Patent: Mar. 29, 2005

(54) SEM SAMPLE HOLDER APPARATUS FOR IMPLEMENTING ENHANCED EXAMINATION OF MULTIPLE SAMPLES

(75) Inventors: Gregory Ervin Balcome, Rochester, MN (US); Kevin Albert Splittstoesser, Stewartville, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/728,298

(22) Filed: Dec. 4, 2003

(51) Int. Cl.[7] ................................................. H01J 37/04
(52) U.S. Cl. ............................. 250/440.11; 250/442.11
(58) Field of Search ...................... 250/440.11, 442.11, 250/310

(56) References Cited

U.S. PATENT DOCUMENTS 4,745,297 A * 5/1988 Sullivan et al. ........ 250/440.11

2003/0032067 A1 * 2/2003 Hefti ........................ 435/7.9

* cited by examiner

Primary Examiner—Kiet T. Nguyen
(74) Attorney, Agent, or Firm—Joan Pennington

(57) ABSTRACT

A method and a scanning electron microscope (SEM) holder apparatus are provided for implementing examination of multiple samples. The SEM holder apparatus includes a metal plate. The metal plate includes a plurality of through holes arranged in a predefined pattern, a mounting opening, and an O-ring receiving recess extending within the metal plate to the plurality of through holes. The SEM holder apparatus includes a plurality of sample holders, each inserted within a selected one of the plurality of through holes. An O-ring is inserted within the O-ring receiving recess to provide a secure mounting of the plurality of sample holders. The O-ring protrudes partially into the through holes receiving the sample holders, providing positive holding pressure that ensures a secure mounting of the sample holders to provide electrical conductivity and vibration suppression.

16 Claims, 3 Drawing Sheets

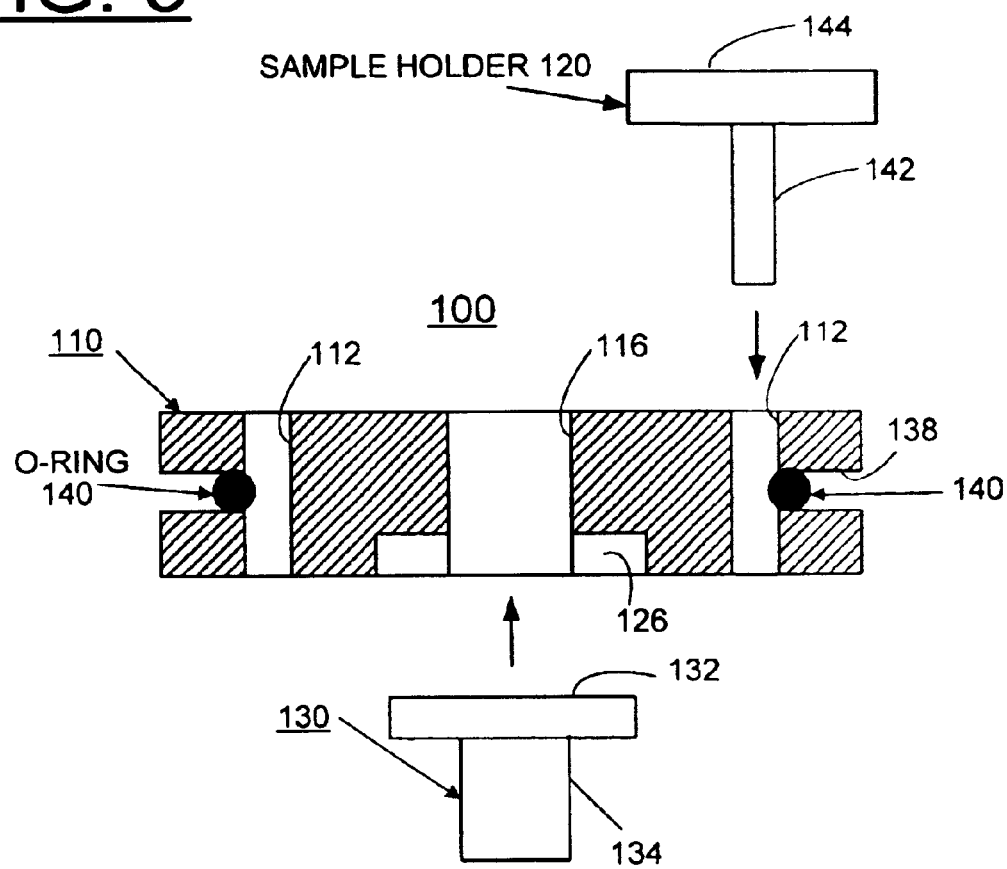
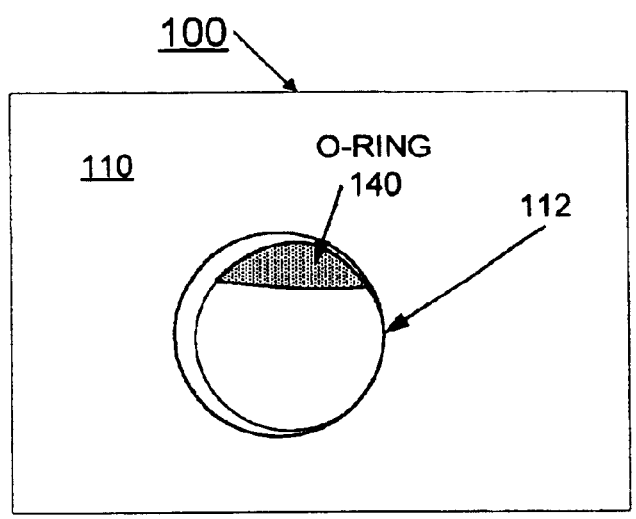

SEM SAMPLE HOLDER APPARATUS FOR IMPLEMENTING ENHANCED EXAMINATION OF MULTIPLE SAMPLES

FIELD OF THE INVENTION

The present invention relates generally to the data processing field, and more particularly, relates to a method and a scanning electron microscope (SEM) holder apparatus for implementing enhanced examination of multiple samples.

DESCRIPTION OF THE RELATED ART

Various types of sample holders for use with a scanning electron microscope (SEM) including multiple sample holders are commercially available. However, a significant disadvantage resulting from the use of the known SEM sample holders is that the overall process of mounting multiple new samples for examination requires significant time.

For example, changing samples in an SEM usually requires turning the instrument off, removing the old sample, remounting the new sample, then re-evacuating the sample chamber, which again could take 1–5 minutes depending on the type of instrument being used.

In addition to being generally time consuming, typically known SEM multiple sample holders require special procedures for sample removal and replacement that may include the requirement of special tooling, for example, to tighten or hold the samples in place.

A need exists for an effective mechanism for implementing enhanced examination of multiple samples.

SUMMARY OF THE INVENTION

A principal object of the present invention is to provide a scanning electron microscope (SEM) holder apparatus for implementing examination of multiple samples. Other important objects of the present invention are to provide such scanning electron microscope (SEM) holder apparatus substantially without negative effect and that overcome many of the disadvantages of prior art arrangements.

In brief, a method and a scanning electron microscope (SEM) holder apparatus are provided for implementing examination of multiple samples. The SEM holder apparatus includes a metal plate. The metal plate includes a plurality of through holes arranged in a predefined pattern, a mounting opening, and an O-ring receiving recess extending within the metal plate to the plurality of through holes. The SEM holder apparatus includes a plurality of sample holders, each inserted within a selected one of the plurality of through holes. An O-ring is inserted within the O-ring receiving recess to provide a secure mounting of the plurality of sample holders.

In accordance with features of the invention, the O-ring protrudes partially into the through holes receiving the sample holders, providing positive holding pressure that ensures a secure mounting of the sample holders to provide electrical conductivity and vibration suppression.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a side sectional view not to scale taken along the line 3—3 of the scanning electron microscope (SEM) holder apparatus of FIG. 1 together with an example sample holder and an example SEM stage holder in accordance with the preferred embodiment; and FIG. 4 is an enlarged fragmentary view not to scale illustrating of the scanning electron microscope (SEM) holder apparatus of FIG. 1 in accordance with the preferred embodiment.

DETAILED DESCRIPTION OF THE PREFERRED EMBODIMENTS

Figure 1:
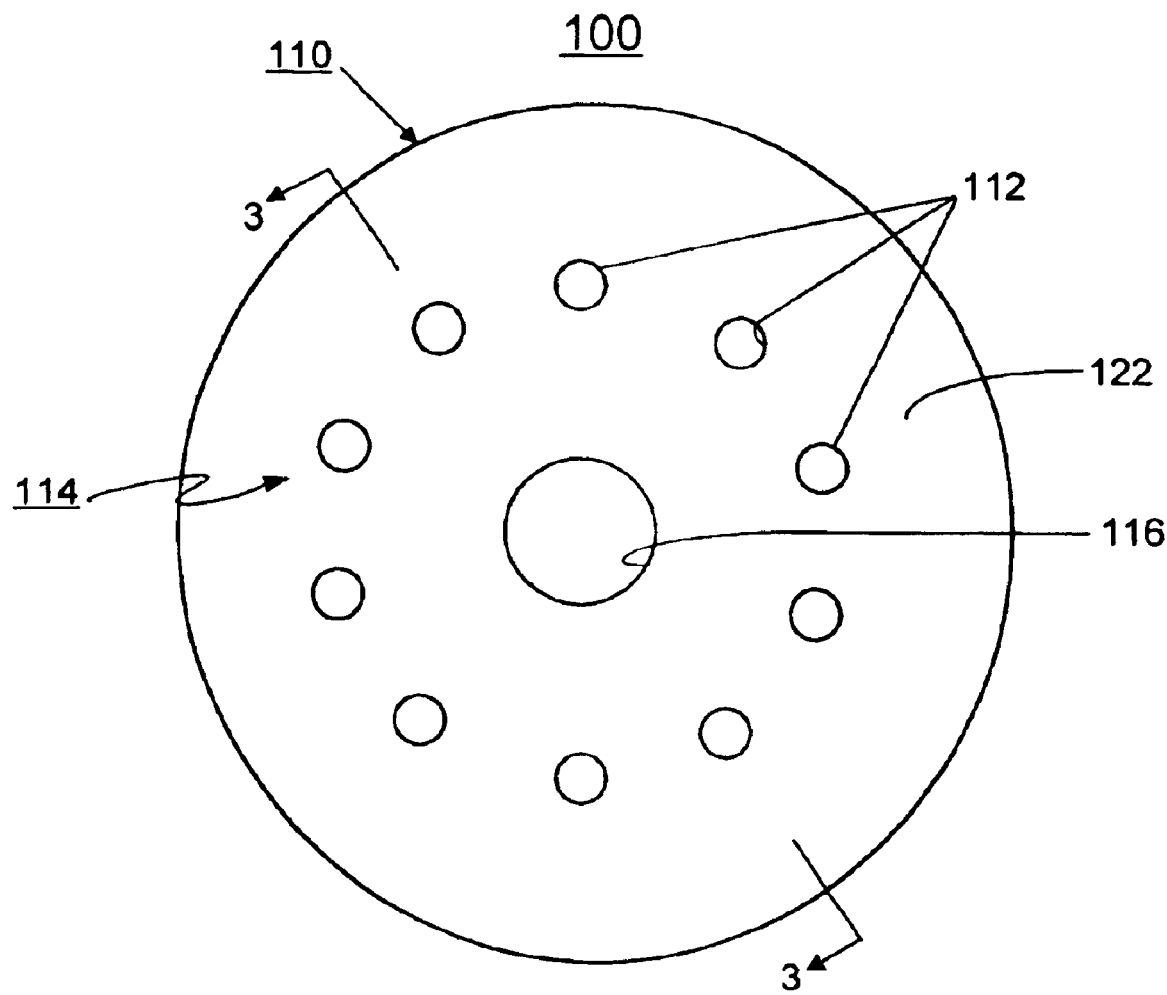
FIG. 1 is a top plan view not to scale of an exemplary scanning electron microscope (SEM) holder apparatus for implementing examination of multiple samples in accordance with the preferred embodiment.

Having reference now to the drawings, in FIGS. 1–4, there is shown a scanning electron microscope (SEM) holder apparatus generally designated by the reference character 100 in accordance with the preferred embodiment. SEM holder apparatus 100 of the preferred embodiment enables enhanced examination of multiple samples.

SEM holder apparatus 100 in accordance with the preferred embodiment includes a metal plate 110 containing a plurality of through holes 112 arranged in a predetermined pattern generally designated by the reference character 114, such as, uniformly spaced apart along a common diameter, as shown. As shown, the metal plate 110 is a circular member having a centrally located through hole 116, and includes ten uniformly spaced apart through holes 112 provided along a common diameter. The predetermined pattern 114 of the plurality of through holes 112 is provided for receiving a selected number of sample holders 120, for example, as shown in FIG. 3. The centrally located through hole 116 is substantially larger than through holes 112 and is used for mounting the metal plate 110 onto a SEM stage holder 130, as illustrated and described with respect to FIG. 3.

For example, SEM holder apparatus 100 can be implemented with a circular metal plate 110 having approximately a 3.0 inch diameter, and the ten through holes 112 have a selected diameter for receiving the sample holders 120, such as, a 0.125 inch diameter and are provided along a common diameter of approximately a 2.0 inch. SEM holder apparatus 100 can be made from a standard 3.0 inch diameter aluminum bar having a thickness of about 0.40–0.50 inch.

The SEM holder apparatus 100, formed as a 3 inch diameter by 0.5 inch thick aluminum holder, is adapted for use in all commercially available large chamber SEMs that are prevalent throughout the industry today.

In accordance with features of the preferred embodiment, the universal SEM holder apparatus 100 allows examination in a large chamber scanning electron microscope (SEM) without having to vent and insert new samples over and over. For example, SEM holder apparatus 100 allows examination of up to ten 13 mm sample stubs, each received in a respective through hole 112, or larger sample stubs, such as five 25 mm sample stubs each received in a respective alternate ones of spaced apart through hole 112

Figure 2:
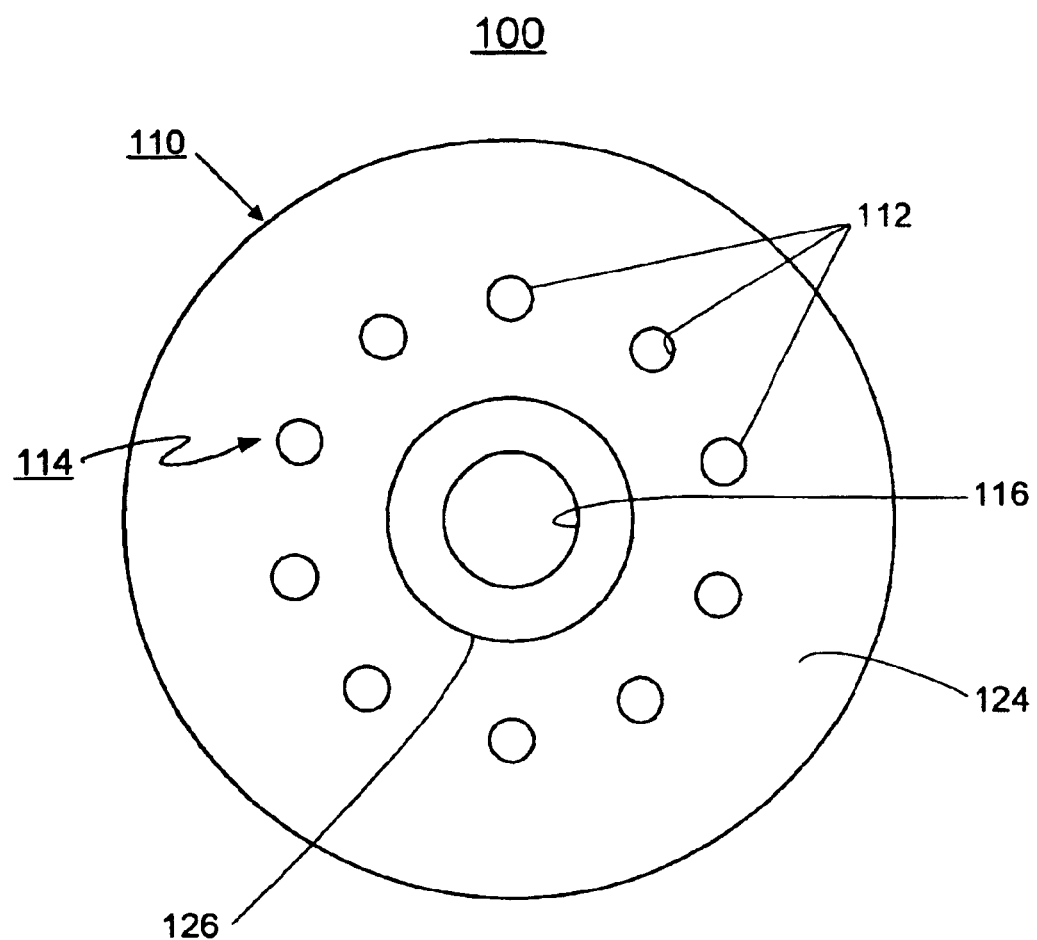
FIG. 2 is a bottom plan view not to scale of the scanning electron microscope (SEM) holder apparatus of FIG. 1 in accordance with the preferred embodiment.

Referring to FIGS. 1 and 2, there are shown respective top and bottom sides 122, 124 of the metal plate 110. The metal plate 110 has a recessed portion or mounting opening 126 surrounding the centrally located through hole 116.

Referring also to FIGS. 3 and 4, there is shown an example SEM stage holder 130 that includes an upper portion 132 extending above a downwardly extending portion 134. The metal plate 110 is mounted onto the SEM stage holder 130. The upper portion 132 of the SEM stage holder 130 is, for example, slideably or threadingly received within the aperture 126 of the metal plate 110. The SEM stage holder 130 is, for example, installed into the aperture 126 from the bottom 124 of the metal plate 110, and bond with an easy to remove carbon filled tape or colloidal carbon (not shown), which are common commodities in the SEM field.

An O-ring receiving recess 138 is formed in the metal plate 110 that extends within the metal plate 110 to the plurality of through holes 112. An O-ring 140 protrudes partially into the through holes 112 that receive the sample holders 120. The sample holder 120 includes a downwardly extending portion 142 and an upper sample support portion 144. The downwardly extending portion 142 is inserted into the through holes 112, and is engaged by the O-ring 140. The O-ring 140 has a diameter that is less than a common diameter of the pattern 114 of the through holes 112. For example, with the through holes 112 spaced apart along a common diameter of 2.00 inches, the O-ring 140 has a diameter of about 1.40 and a width that is slightly less than a height of the recess 138.

In accordance with features of the preferred embodiment, the O-ring 140 is used like an elastic band around the sample holders 120. The O-ring 140 in the SEM holder apparatus 100 provides elastic tension to one side of the sample holder through holes 112. In the SEM holder apparatus 100, positive holding pressure due to the O-ring 140 protruding partially into the sample holder through holes 112 ensures a secure mounting that provides the required electrical conductivity and vibration suppression. The O-ring 140 in the SEM holder apparatus 100 eliminates the need for retaining set screws of conventional SEM sample holder arrangements.

In accordance with features of the preferred embodiment, the SEM holder apparatus 100 is a quick mount multiple sample holder, that saves vent time between samples, which can be up to 5 minutes per sample, and eliminates SEM down time due to sample removal and replacement. SEM holder apparatus 100 enables a one-time setup for multiple sample examination, such as to examine up to 10 samples. SEM holder apparatus 100 is especially useful for numerous, routine samples that are common in many material, hospital, industrial, college and university labs along with applications in manufacturing and development markets that typically would include inspection and process quality control sample inspects.

It should be understood that the sample holders 120 and the through holes 112 do not need to be circular in cross-section. It should be understood that the SEM holder apparatus 100 can be used for sample holders 120 having, for example, square or other cross-sections with the through holes 112 having a corresponding configuration.

While the present invention has been described with reference to the details of the embodiments of the invention shown in the drawing, these details are not intended to limit the scope of the invention as claimed in the appended claims.

What is claimed is:

1. A method for implementing enhanced examination of multiple samples comprising the steps of:

providing a metal plate including a plurality of through holes arranged in a predefined pattern, a mounting opening, and an O-ring receiving recess extending within said metal plate to said plurality of through holes;

inserting a plurality of sample holders, each within a selected one of said through holes; and installing an O-ring within said O-ring receiving recess to engage each of said plurality of sample holders and to provide positive holding pressure for a secure mounting of said plurality of sample holders.

2. A method for implementing enhanced examination of multiple samples as recited in claim 1 includes the step of mounting said metal plate to a stage holder; said stage holder having an upper portion extending above a base portion, and said upper portion inserted into said mounting opening of said metal plate.

3. A method for implementing enhanced examination of multiple samples as recited in claim 1 wherein the step of providing said metal plate includes the step of providing a metal plate formed of aluminum.

4. A method for implementing enhanced examination of multiple samples as recited in claim 1 wherein the step of providing said metal plate includes the step of providing a circular metal plate.

5. A method for implementing enhanced examination of multiple samples as recited in claim 1 wherein the step of providing said metal plate includes the step of providing a circular metal plate including said plurality of through holes arranged uniformly spaced apart along a common diameter.

6. A method for implementing enhanced examination of multiple samples as recited in claim 5 includes the step of providing said O-ring with a diameter less than said common diameter.

7. A scanning electron microscope (SEM) holder apparatus for implementing enhanced examination of multiple samples comprising:

a metal plate, said metal plate including a plurality of through holes arranged in a predefined pattern, a mounting opening, and an O-ring receiving recess extending within said metal plate to said plurality of through holes;

a plurality of sample holders, each received within a selected one of said plurality of through holes; and an O-ring received within said O-ring receiving recess to engage each of said plurality of sample holders and to provide positive holding pressure for a secure mounting of said plurality of sample holders.

8. A scanning electron microscope (SEM) holder apparatus as recited in claim 7 wherein said metal plate is formed of aluminum.

9. A scanning electron microscope (SEM) holder apparatus as recited in claim 7 includes a stage holder; said stage holder having an upper portion extending above a base portion, and said upper portion inserted into said mounting opening of said metal plate.

10. A scanning electron microscope (SEM) holder apparatus as recited in claim 7 wherein each of said plurality of sample holders includes a: downwardly extending portion and an upper sample support portion; said downwardly extending portion is inserted into said through hole and is engaged by said O-ring.

11. A scanning electron microscope (SEM) holder apparatus as recited in claim 7 wherein said plurality of through holes is arranged uniformly spaced apart along a common diameter.

12. A scanning electron microscope (SEM) holder apparatus as recited in claim 11 wherein said O-ring has a selected diameter less than said common diameter, whereby said O-ring protrudes partially into said through holes.

13. A scanning electron microscope (SEM) holder apparatus as recited in claim 7 wherein said metal plate is formed of circular member.

14. A scanning electron microscope (SEM) holder apparatus as recited in claim 7 wherein said metal plate is formed of circular aluminum bar.

15. A scanning electron microscope (SEM) holder apparatus as recited in claim 14 wherein said metal plate has a diameter of about 3 inches.

16. A scanning electron microscope (SEM) holder apparatus as recited in claim 15 wherein said plurality of through holes is arranged uniformly spaced apart along a common diameter of about 2 inches.

* * * * *